US009325491B2

(12) United States Patent
El Moznine et al.

(10) Patent No.: US 9,325,491 B2
(45) Date of Patent: Apr. 26, 2016

(54) CLOCK GENERATION CIRCUIT WITH DUAL PHASE-LOCKED LOOPS

(71) Applicant: TriQuint Semiconductor, Inc., Hillsboro, OR (US)

(72) Inventors: Abdellatif El Moznine, Cupertino, CA (US); Patrick T. Clancy, Santa Cruz, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 14/303,550

(22) Filed: Jun. 12, 2014

(65) Prior Publication Data

US 2015/0295582 A1 Oct. 15, 2015

Related U.S. Application Data

(60) Provisional application No. 61/979,964, filed on Apr. 15, 2014.

(51) Int. Cl.
*H04L 7/033* (2006.01)
*H03L 7/10* (2006.01)
*H03L 7/23* (2006.01)

(52) U.S. Cl.
CPC .............. *H04L 7/0331* (2013.01); *H03L 7/10* (2013.01); *H03L 7/23* (2013.01); *H03L 2207/12* (2013.01)

(58) Field of Classification Search
CPC ............ H03L 2207/06; H03L 2207/12; H03L 2207/10; H03L 2207/50; H03L 7/087; H03L 7/06; H03L 7/07; H03L 7/185; H03L 7/08; H03L 7/0805; H03L 7/22; H03L 7/033
USPC .......................... 375/252, 294, 307, 327, 376
See application file for complete search history.

(56) References Cited

U.S. PATENT DOCUMENTS

| | | | | |
|---|---|---|---|---|
| 3,588,730 A * | 6/1971 | Schreuer et al. | ................... | 331/2 |
| 4,234,929 A * | 11/1980 | Riley, Jr. | ........................ | 708/101 |
| 4,839,603 A * | 6/1989 | Mower | ....................... | H03L 7/23 |
| | | | | 327/105 |
| 5,105,168 A * | 4/1992 | DaSilva | .................... | H03C 1/06 |
| | | | | 327/156 |
| 5,175,872 A * | 12/1992 | Borras | ............................ | 455/76 |
| 5,267,182 A * | 11/1993 | Wilke | .......................... | 708/103 |
| 5,374,902 A * | 12/1994 | Bradley | .................. | H03L 7/087 |
| | | | | 331/11 |
| 5,391,996 A * | 2/1995 | Marz | .............................. | 327/158 |
| 5,610,558 A * | 3/1997 | Mittel | ....................... | H03L 7/07 |
| | | | | 327/147 |
| 5,675,273 A * | 10/1997 | Masleid | ..................... | G06F 1/10 |
| | | | | 327/156 |
| 5,777,521 A * | 7/1998 | Gillig | .................... | H03L 7/1976 |
| | | | | 331/16 |
| 5,815,016 A * | 9/1998 | Erickson | .................... | G06F 1/10 |
| | | | | 327/158 |
| 5,828,257 A * | 10/1998 | Masleid | ...................... | H03L 7/07 |
| | | | | 327/158 |
| 5,939,951 A * | 8/1999 | Bateman | ................... | H03C 1/06 |
| | | | | 329/308 |
| 6,072,347 A * | 6/2000 | Sim | .......................... | H03K 5/13 |
| | | | | 327/141 |
| 6,115,586 A * | 9/2000 | Bezzam et al. | ............... | 455/112 |
| 6,208,875 B1 * | 3/2001 | Damgaard et al. | ......... | 455/552.1 |

(Continued)

*Primary Examiner* — Emmanuel Bayard

(74) *Attorney, Agent, or Firm* — Withrow & Terranova, P.L.L.C.

(57) ABSTRACT

Embodiments provide a clock generation circuit with a first phase-locked loop (PLL) and a second PLL that are coupled in parallel with one another and receive a same feedback signal. The first and second PLLs generate respective output signals that are combined to generate an output clock signal. A version of the output clock signal may be passed back to the first and second PLLs as the feedback signal. In some embodiments, the second PLL may include a switch to selectively close the second PLL after the first PLL has locked. In some embodiments, the second PLL may include a bulk acoustic wave (BAW) voltage-controlled oscillator (VCO) and the first PLL may include a different type of VCO.

21 Claims, 3 Drawing Sheets

(56) References Cited

U.S. PATENT DOCUMENTS

| | | | |
|---|---|---|---|
| 6,411,660 B1 * | 6/2002 | Oh | 375/327 |
| 6,424,826 B1 * | 7/2002 | Horton et al. | 455/255 |
| 6,429,734 B1 * | 8/2002 | Wang | H03F 3/45941; 327/156 |
| 6,452,432 B2 * | 9/2002 | Kim | 327/158 |
| 6,469,550 B1 * | 10/2002 | Kurd | H03L 7/07; 327/141 |
| 6,522,206 B1 * | 2/2003 | Kornblum | H03L 7/0898; 331/1 A |
| 6,720,810 B1 * | 4/2004 | New | G06F 1/12; 327/158 |
| 6,741,109 B1 * | 5/2004 | Huang | H03L 7/081; 327/148 |
| 6,766,178 B1 * | 7/2004 | Damgaard | H03L 7/23; 455/216 |
| 6,920,622 B1 * | 7/2005 | Garlepp | H03L 7/081; 327/147 |
| 6,937,107 B2 * | 8/2005 | Ravi | H03B 27/00; 331/47 |
| 6,985,043 B2 * | 1/2006 | Atsumi et al. | 331/94.1 |
| 7,050,777 B2 * | 5/2006 | Cai | H03L 1/00; 455/295 |
| 7,091,763 B1 * | 8/2006 | Johnson | G06F 1/10; 327/175 |
| 7,119,550 B2 * | 10/2006 | Kitano | G01C 19/56; 324/658 |
| 7,324,788 B2 * | 1/2008 | Ramet et al. | 455/76 |
| 7,383,028 B2 * | 6/2008 | Suzuki | H03F 1/3247; 375/296 |
| 7,423,468 B2 * | 9/2008 | Cho | H03L 7/0814; 327/172 |
| 7,535,274 B2 * | 5/2009 | Ong | H03K 5/156; 327/158 |
| 7,622,996 B2 * | 11/2009 | Liu | H03L 7/087; 331/10 |
| 7,629,824 B2 * | 12/2009 | Cho | H03L 7/0814; 327/172 |
| 7,755,401 B2 * | 7/2010 | Abe | H03L 7/0814; 327/149 |
| 7,915,939 B2 * | 3/2011 | Jang | H03K 5/1565; 327/158 |
| 7,933,569 B2 * | 4/2011 | Suzuki | H03F 1/3247; 375/296 |
| 7,982,510 B2 * | 7/2011 | Casagrande | H03C 3/0925; 327/148 |
| 8,415,999 B2 * | 4/2013 | Ding | H03L 7/22; 327/148 |
| 8,509,372 B1 * | 8/2013 | Zhang | H03L 7/087; 331/44 |
| 8,581,648 B2 * | 11/2013 | Ding | H03L 7/22; 327/148 |
| 8,588,721 B2 * | 11/2013 | Alzaher | H04B 1/406; 455/130 |
| 8,638,144 B1 * | 1/2014 | Shyu | H03L 7/0814; 327/12 |
| 8,816,777 B2 * | 8/2014 | Szilagyi | 331/2 |
| 8,975,973 B2 * | 3/2015 | Sato | H03L 7/16; 331/172 |
| 9,147,452 B2 * | 9/2015 | Na | G11C 7/222 |
| 2007/0103247 A1 * | 5/2007 | Yokota et al. | 331/158 |
| 2008/0063129 A1 * | 3/2008 | Voutilainen | 375/376 |
| 2011/0248755 A1 * | 10/2011 | Hasenplaugh | H03L 7/087; 327/157 |
| 2012/0200453 A1 * | 8/2012 | Brosche | 342/175 |
| 2015/0180594 A1 * | 6/2015 | Chakraborty | H03L 7/0802; 455/87 |

* cited by examiner

CLOCK GENERATION CIRCUIT WITH DUAL PHASE-LOCKED LOOPS

CROSS REFERENCE TO RELATED APPLICATIONS

The present application claims priority to U.S. Provisional Patent Application No. 61/979,964, filed Apr. 15, 2014 and entitled "CLOCK GENERATION CIRCUIT WITH DUAL PHASE-LOCKED LOOPS," the entire disclosure of which is hereby incorporated by reference in its entirety.

FIELD

Embodiments of the present disclosure relate generally to the field of circuits, and more particularly to clock generation circuits.

BACKGROUND

In network communication systems including wireline and wireless infrastructure, increasingly higher data rates and higher order modulation are requiring clock signals with lower phase noise and lower jitter, for example for data converters and local oscillator references. However, to meet these requirements, current clock generators are power-inefficient, bulky, and costly.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1:
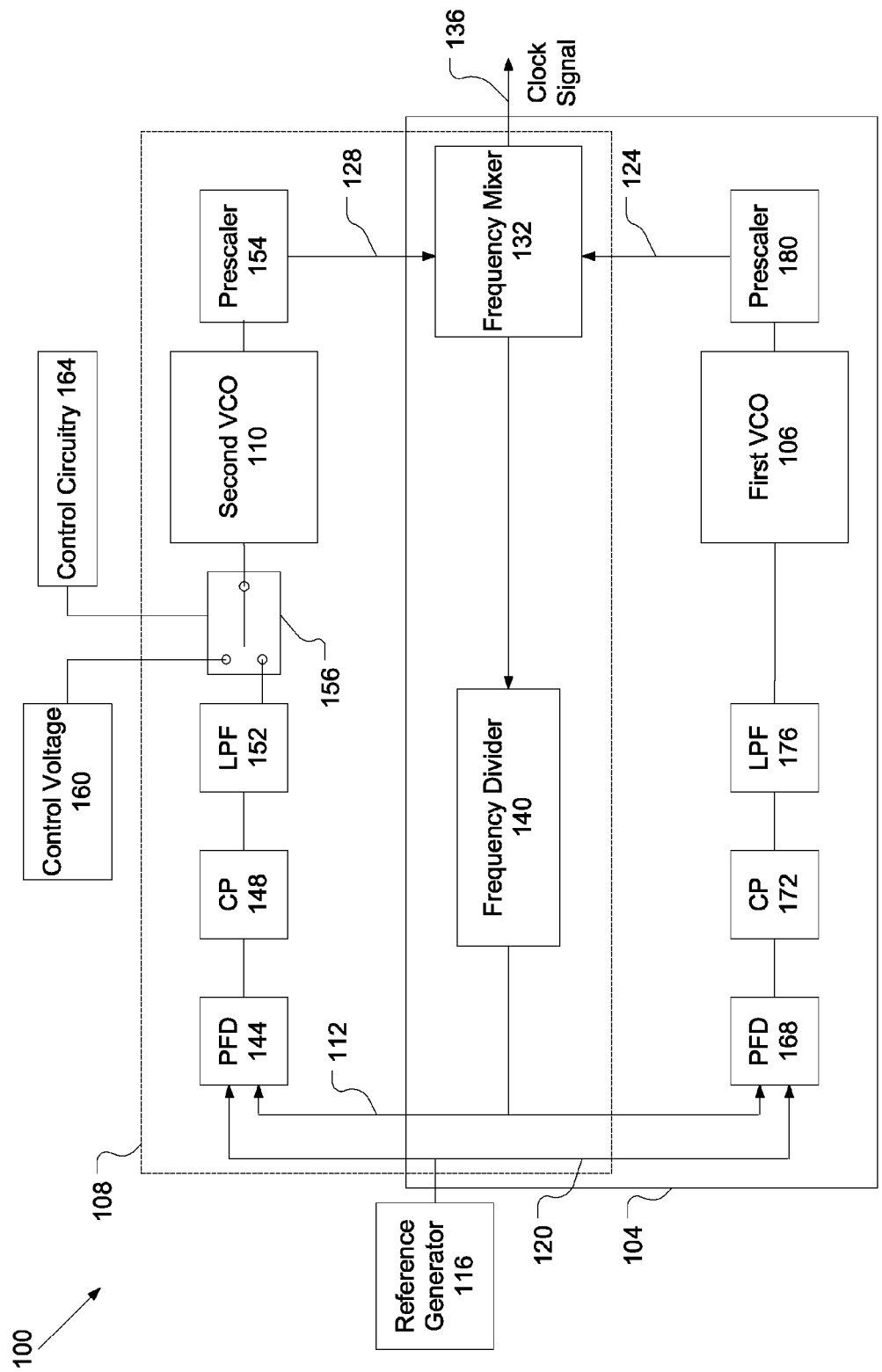
FIG. 1 schematically illustrates a circuit diagram of a clock generation circuit in accordance with various embodiments.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C), or (A, B, and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Various embodiments include a clock generation circuit with a first phase-locked loop (PLL) and a second PLL that are coupled in parallel with one another. The first PLL and second PLL may receive a same feedback signal and a same reference signal and may generate respective first or second output signals based on the feedback signal and the reference signal. The first and second output signals may be combined (e.g., by a frequency mixer) to generate an output clock signal. A version of the output clock signal (e.g., the output clock signal or a frequency-divided version of the output clock signal) may be passed back to the first and second PLLs as the feedback signal.

In various embodiments, the first PLL may include a first voltage-controlled oscillator (VCO) and the second PLL may include a second VCO. The first VCO may be of a different type than the second VCO. For example, the second VCO may have a higher output frequency, lower noise, higher Q (quality factor), and/or narrower tuning range than the first VCO. Additionally, the second output signal may have a higher frequency than the first output signal. Furthermore, in some embodiments, the first PLL may have a higher gain than the second PLL. The higher gain of the first PLL may allow the first PLL to respond more quickly to drift and/or a perturbation in the output clock signal, thereby causing the first PLL to compensate for the majority of the drift and/or perturbation of the output clock signal (e.g., relative to the compensation provided by the second PLL). The use of a higher frequency and higher Q VCO, with low noise and low jitter, for the second VCO allows the clock generation circuit to generate an output clock signal with low noise and low jitter.

In some embodiments, the second PLL may further include a switch to selectively open or close the second PLL. The switch may maintain the second PLL open during an initial time period after power-up of the clock generation circuit and may provide a pre-determined control voltage to the second VCO during the initial time period. The pre-determined control voltage may correspond substantially to a middle of a tuning range of the second VCO. The switch may close the second PLL after the first PLL has achieved lock. Accordingly, the second PLL may achieve lock at a control voltage that is close to the pre-determined control voltage (e.g., in the middle of the tuning range of the second VCO).

Therefore, the clock generation circuit may provide the advantages of the low-noise and high-Q of the second VCO while compensating for the low tuning range of the second VCO using the first VCO and/or the switch to provide correction for the initial frequency error.

While various embodiments refer to generation of a clock signal, it will be apparent that the described embodiments may be used to generate any type of low-noise, low-jitter periodic signal, such as a local oscillator used in transceiver up/down frequency conversion. Accordingly, the term clock signal, as used herein, may encompass any suitable type of periodic signal.

FIG. 1 illustrates a clock generation circuit 100 in accordance with various embodiments. Clock generation circuit 100 (also referred to as circuit 100 or clock generator 100) may include a first PLL 104 and a second PLL 108 coupled with a same feedback node 112. The clock generation circuit 100 may generate a feedback signal at the feedback node 112, as further explained herein. The clock generation circuit 100 may further include a reference generator 116 to provide a reference signal at a reference node 120. In some embodiments, the reference generator 116 may include a crystal oscillator, such as a voltage-controlled crystal oscillator. In some embodiments, the reference generator 116 may further include a reference divider to divide the frequency of the signal generated by the oscillator of the reference generator 116.

In various embodiments, the first PLL 104 may include a first VCO 106, and the second PLL 108 may include a second VCO 110. The first PLL 104 may receive the feedback signal and the reference signal and may generate a first output signal, at a first output terminal 124, based on the feedback signal and the reference signal. The second PLL 108 may receive the feedback signal and the reference signal and may generate a second output signal, at a second output terminal 128, based on the feedback signal and the reference signal. In some embodiments, the first and/or second output signals may be differential signals. In other embodiments, the first and/or second output signals may be single-ended signals.

In various embodiments, the circuit 100 may further include a frequency mixer 132 that is coupled with the first PLL 104 and second PLL 108 to receive the first and second output signals. The frequency mixer 132 may generate a clock signal at a clock terminal 136 based on the first and second output signals. For example, the clock signal may have a frequency that is approximately equal to a sum or difference of the frequency of the first output signal and the frequency of the second output signal. In some embodiments, the frequency mixer 132 may include a frequency summer, such as a single side-band mixer.

In various embodiments, the frequency mixer 132 may also pass a version of the clock signal back to the feedback node as the feedback signal. In some embodiments, the circuit 100 may include a frequency divider 140 coupled between the frequency mixer 132 and the feedback node 112 to generate the feedback signal based on the clock signal. For example, the frequency divider 140 may reduce the frequency of the clock signal (e.g., via frequency division) to be approximately equal to a frequency of the reference signal. In some embodiments, the frequency divider 140 may be an integer or fractional frequency divider. A division factor of the frequency divider 140 may be chosen based on a desired frequency of the clock signal relative to the frequency of the reference signal.

In various embodiments, the second PLL 108 may include a phase and frequency detector (PFD) 144, a charge pump (CP) 148, and/or a low-pass filter (LPF) 152 coupled in series with one another between the feedback node 112 and the second VCO 110. In some embodiments, the second PLL 108 may further include a prescaler 154 coupled between the second VCO 110 and the second output terminal 128 to scale (e.g., divide or multiply) the output signal generated by the second VCO 110 to provide the second output signal at the second output terminal 128.

In some embodiments, the second PLL 108 may further include a switch 156 to selectively open or close the second PLL 108. For example, when the second PLL 108 is closed, the switch 156 may provide a conductive path from the feedback node 112 to the output node 128 via the second VCO 110. When the second PLL 108 is open, the switch 156 may couple the second VCO 110 with a pre-determined control voltage 160. The switch 156 may be controlled by control circuitry 164.

In various embodiments, the second PLL 108 may be open for a time period upon powering on the circuit 100. Accordingly, the second VCO 110 may receive the pre-determined control voltage 160. In some embodiments, the pre-determined control voltage 160 may correspond substantially to a middle of a tuning range of the second VCO 110 (e.g., a range of control voltages over which the second VCO 110 operates effectively). In various embodiments, the switch 156 may close the second PLL 108 after the first PLL 104 has achieved lock (e.g., when the feedback signal is substantially similar to the reference signal in phase and/or frequency). For example, the control circuitry 164 may control the switch 156 to close the second PLL 108 responsive to a lock-detect signal that indicates whether the first PLL 104 has locked.

In various embodiments, the first PLL 104 may include a PFD 168, a charge pump (CP) 172, and/or a low-pass filter (LPF) 176 coupled in series with one another between the feedback node 112 and the first VCO 106. In some embodiments, the first PLL 104 may further include a prescaler 180 coupled between the first VCO 106 and the first output terminal 124 to scale (e.g., divide or multiply) the frequency of the output signal generated by the first VCO 110 to provide the first output signal at the first output terminal 124.

The PFD 168 may compare the phase and/or frequency of the feedback signal with the phase and/or frequency, respectively, of the reference signal and may generate a control signal based on the comparison. The control signal may be passed through the charge pump 172 and low-pass filter 176 and used to control the output signal generated by the first VCO 106. The control signal may be adjusted by the PFD 168 to make the feedback signal approximately equal to the reference signal in phase and/or frequency. Once the feedback signal is approximately equal to the reference signal in phase and/or frequency, the first PLL 104 is considered to have achieved lock. The first PLL may generate a lock detect signal to indicate when the first PLL 104 has achieved lock.

As discussed above, the switch 156 may close the second PLL 108, e.g., responsive to the lock detect signal, after the first PLL 104 has locked. The PFD 144 may compare the phase and/or frequency of the feedback signal with the phase and/or frequency, respectively, of the reference signal and may generate a control signal based on the comparison. The control signal may be passed through the charge pump 148 and low-pass filter 152 and, when the second PLL 108 is closed, used to control the output signal generated by the second VCO 110. The control signal may be adjusted by the PFD 144 to make the feedback signal approximately equal to the reference signal in phase and/or frequency.

In various embodiments, the second VCO 110 may be of a different type than the first VCO 106. For example, the second VCO 110 may have a lower noise, a higher Q, a narrower tuning band (e.g., range of output frequencies), and/or a higher output frequency than the first VCO 106. In some embodiments, the second VCO 110 may be a bulk acoustic wave (BAW) oscillator. The first VCO 106 may be, for example, an inductance-capacitance (LC) oscillator. Additionally, or alternatively, the first PLL 104 may have a higher gain than the second PLL 108.

In various embodiments, the higher gain of the first PLL 104 relative to the second PLL 108 may allow the first PLL 104 to respond more quickly to drift in the output clock signal, thereby causing the first PLL 104 to compensate for the majority of the drift of the output clock signal (e.g., relative to the compensation provided by the second PLL). Additionally, closing the second PLL 108 after the first PLL 104 has achieved lock may allow the second PLL 104 to achieve lock at a control voltage of the second VCO 110 that is close to the pre-determined control voltage 160. Accordingly, a narrow-band high-Q VCO, such as a BAW VCO, may be used for the second VCO 110. The high Q and low phase-noise of the second VCO 110 may provide low jitter for the second output signal.

Additionally, because of the higher frequency of the second output signal, the second PLL 108 may contribute a majority of the frequency of the output clock signal. Since the first PLL 104 generates a relatively low frequency, the first PLL 104 may have relatively low noise and low jitter compared with PLL 108. Accordingly, the first output signal may also exhibit low noise and low jitter. Therefore, the output clock signal generated by the circuit 100 from the first and second output signals may have low noise and low jitter, and the circuit 100 may also have a wide tuning range.

In various embodiments, the division factors of the frequency divider 140, prescaler 154, and/or prescaler 180 may be selected based on a number of factors, including a desired frequency of the output clock signal, a frequency of the reference signal, a tuning range and/or center frequency of the first VCO 106, and/or a tuning range and/or center frequency of the second VCO 110. For example, in one non-limiting embodiment, the reference signal may have a frequency of about 30.72 MegaHertz (MHz) and the desired frequency of the output clock signal may be about 1228.8 MHz. Accordingly, the division factor of the frequency divider may be about 40 (i.e., 1228.8/30.72=40). Additionally, the first VCO 106 may have a center frequency of about 230.4 MHz, and the second VCO 110 may have a center frequency of about 2400 MHz. In some embodiments, the division factor of the prescaler 180 may be about 8 and the division factor of the prescaler 154 may be about 2, thereby generating the output clock signal with a frequency of 230.4/8+2400/2=1228.8. In some embodiments, the output clock signal may be frequency-divided to generate a clock signal with a different frequency.

Figure 2:
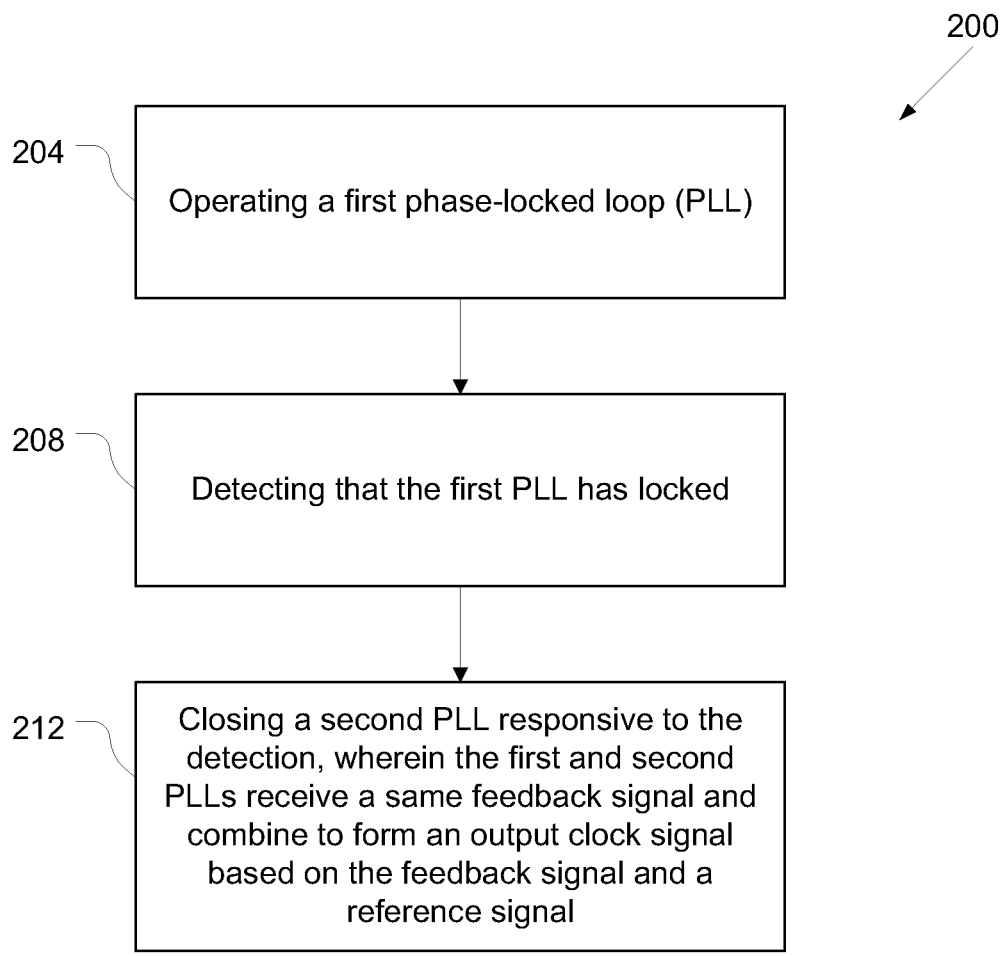
FIG. 2 illustrates a method of operating a clock generation circuit in accordance with various embodiments.

FIG. 2 illustrates a method 200 for operating a clock generation circuit (e.g., clock generation circuit 100) in accordance with various embodiments. In some embodiments, a clock generation circuit may include or be coupled with one or more non-transitory computer-readable media having instructions, stored thereon, that when executed cause the clock generation circuit to perform the method 200.

At 204, the method 200 may include operating a first PLL (e.g., first PLL 104) of a clock generation circuit. Operating the first PLL may include providing electrical power to the first PLL to cause the first PLL to adjust an output signal generated by the first PLL until a feedback signal that is based on the output signal is approximately equal in phase and/or frequency to a reference signal.

At 208, the method 200 may include detecting that the first PLL has locked. For example it may be detected that the first PLL has locked based on a lock-detect signal.

At 212, the method 200 may further include closing a second PLL (e.g., second PLL 108) responsive to the detection at 208. The first and second PLLs may receive a same feedback signal, and may combine to form an output clock signal based on the feedback signal and the reference signal.

In some embodiments, the method 200 may further include providing, prior to closing the second PLL at 212, a control voltage to the second VCO corresponding substantially to a middle of a tuning range of the second VCO.

Figure 3:
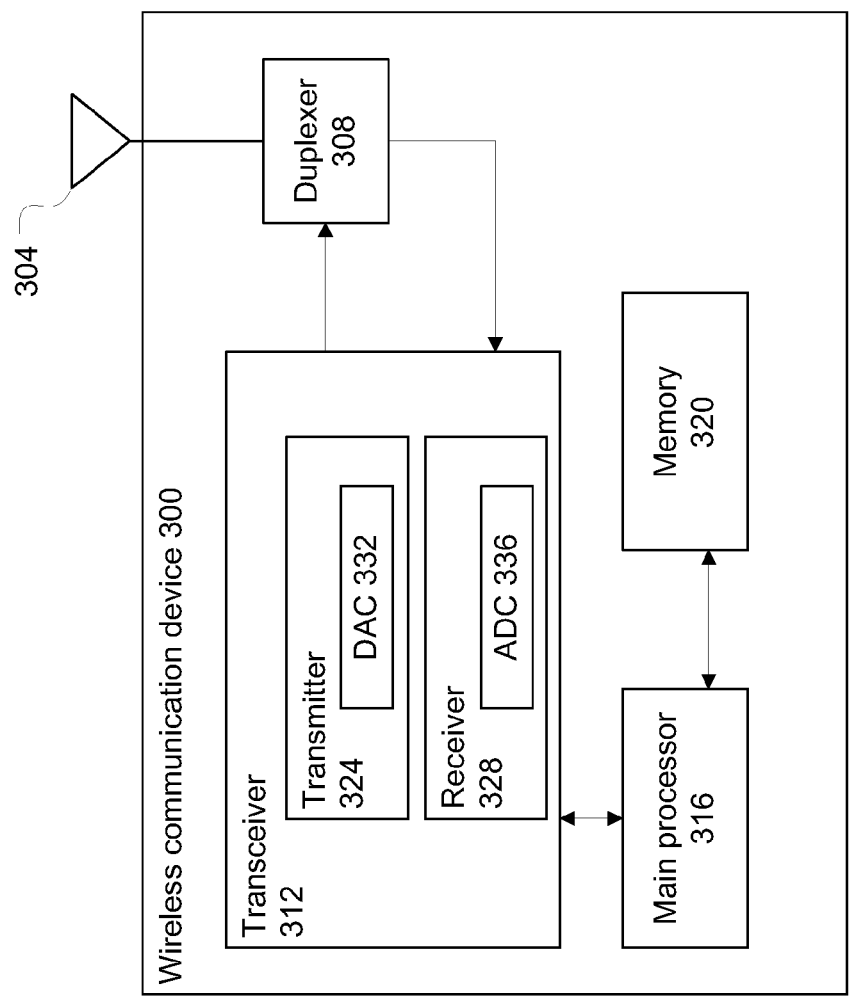
FIG. 3 is a block diagram of an exemplary wireless communication device in accordance with various embodiments.

Clock generation circuit 100 may be used in a number of devices, for example, a wireless communication device 300 as shown in FIG. 3 in accordance with some embodiments. In various embodiments, the wireless communication device 300 may be, but is not limited to, a mobile telephone, a paging device, a personal digital assistant, a text-messaging device, a portable computer, a base station, a radar, a satellite communication device, or any other device capable of wirelessly transmitting and/or receiving RF signals.

The wireless communication device 300 may have an antenna structure 304, a duplexer 308, a transceiver 312, a main processor 316, and a memory 320 coupled with each other at least as shown.

The main processor 316 may execute a basic operating system program, stored in the memory 320, in order to control the overall operation of the wireless communication device 300. For example, the main processor 316 may control the reception of signals and the transmission of signals by the transceiver 312. The main processor 316 may be capable of executing other processes and programs resident in the memory 320 and may move data into or out of memory 320, as desired by an executing process.

The transceiver 312 may include a transmitter 324 for transmitting RF signals, communicating outgoing data, through the duplexer 308 and antenna structure 304. The transceiver 312 may additionally/alternatively include a receiver 328 for receiving RF signals, communicating incoming data, from the duplexer 308 and antenna structure 304. The transmitter 324 may include a digital-to-analog converter (DAC) 332 to process the outgoing signal. The receiver 328 may include an analog-to-digital converter (ADC) 336 to process the incoming signal. The DAC 332 and/or ADC 336 may include the clock generation circuit 100 and/or practice the method 200 in some embodiments. Alternatively, or additionally, the clock generation circuit 100 may be included in another component of the wireless communication device 300, such as in a reference clock for a circuit, such as a serializer/deserializer (SerDes), a digital signal processing (DSP) circuit, and/or an application-specific integrated circuit (ASIC).

In various embodiments, the antenna 304 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 300 is given by way of example and that, for simplicity and clarity, only so much of the construction and operation of the wireless communication device 300 as is necessary for an understanding of the embodiments is shown and described. Various embodiments contemplate any suitable component or combination of components performing any suitable tasks in association with wireless communication device 300, according to particular needs. Moreover, it is understood that the wireless communication device 300 should not be construed to limit the types of devices in which embodiments may be implemented. For example, in some embodiments, the clock generation circuit 100 may be used in a wireline communication device.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
   a feedback node;
   a first phase-locked loop (PLL) coupled with the feedback node, the first PLL including a first voltage-controlled oscillator (VCO) and a first feedback loop to generate a first output signal based on a feedback signal at the feedback node;
   a second PLL coupled with the feedback node, the second PLL including a second VCO and a second feedback loop to generate a second output signal based on the feedback signal at the feedback node, wherein the second output signal has a higher output frequency than the first output signal;
   a frequency mixer coupled with the first and second PLLs to receive the first and second output signals, respectively, and generate a clock signal at an output node based on the first and second output signals.

2. The circuit of claim 1, further comprising a switch to close the second PLL after the first PLL has achieved lock.

3. The circuit of claim 2, wherein the switch is to close the second PLL responsive to a lock-detect signal of the first PLL.

4. The circuit of claim 2, wherein, prior to the switch being closed, the second VCO is to receive a control voltage corresponding substantially to a middle of a tuning range of the second VCO.

5. The circuit of claim 1, wherein the first PLL has a higher gain than the second PLL.

6. The circuit of claim 1, wherein the second PLL has a narrower tuning range than the first PLL.

7. The circuit of claim 1, wherein the first and second PLLs are to generate the respective first or second output signals based further on a reference signal, and
   wherein the circuit further comprises a frequency divider coupled between the frequency mixer and the feedback node to pass a frequency divided version of the clock signal to the feedback node.

8. The circuit of claim 1, wherein the second VCO is a bulk acoustic wave (BAW) VCO.

9. The circuit of claim 8, wherein the first VCO is an inductance-capacitance (LC) VCO.

10. A method comprising:
    operating a first phase-locked loop (PLL) of a clock generation circuit;
    detecting that the first PLL has locked; and
    closing a second PLL responsive to the detection, wherein the first and second PLLs receive a same feedback signal and combine to form an output clock signal based on the feedback signal.

11. The method of claim 10, wherein the first PLL includes a first voltage-controlled oscillator (VCO) and the second PLL includes a second VCO that is of a different type than the first VCO.

12. The method of claim 11, wherein the second VCO is a bulk acoustic wave (BAW) VCO.

13. The method of claim 11, wherein the first PLL has a higher gain than the second PLL.

14. The method of claim 11, wherein the second PLL has a narrower tuning range than the first PLL.

15. The method of claim 11, further comprising providing, prior to closing the second PLL, a control voltage to the second VCO corresponding substantially to a middle portion of a tuning range of the second VCO.

16. A system comprising:
    a transceiver;
    a clock generator coupled with the transceiver, the clock generator comprising:
       a feedback node;
       a first phase-locked loop (PLL) coupled with the feedback node, the first PLL including a first voltage-controlled oscillator (VCO) and a first feedback loop to generate a first output signal based on a feedback signal at the feedback node;
       a second PLL coupled with the feedback node, the second PLL including a second VCO and a second feedback loop to generate a second output signal based on the feedback signal at the feedback node;
       a frequency mixer coupled with the first and second PLLs to generate a clock signal at an output node based on the first and second output signals; and
       control circuitry coupled with the second PLL, the control circuitry configured to:
          open the second PLL and provide a pre-determined control voltage to the second VCO during an initial time period;
          detect that the first PLL has locked; and
          close the second PLL responsive to the detection.

17. The system of claim 16, wherein the pre-determined control voltage corresponds substantially to a middle portion of a tuning range of the second VCO.

18. The system of claim 16, wherein the first PLL has a higher gain than the second PLL.

19. The system of claim 16, wherein the second PLL has a narrower tuning range than the first PLL.

20. The system of claim 16, wherein the first and second PLLs are to generate the respective first or second output signals based further on a reference signal, and wherein the circuit further comprises a frequency divider coupled between the frequency mixer and the feedback node to pass a frequency divided version of the clock signal to the feedback node.

21. The system of claim 16, wherein the first VCO is an inductance-capacitance (LC) VCO and the second VCO is a bulk acoustic wave (BAW) VCO.

* * * * *